United States Patent [19]
Inoue et al.

[11] Patent Number: 5,422,205
[45] Date of Patent: Jun. 6, 1995

[54] MICROPATTERN FORMING METHOD

[75] Inventors: Soichi Inoue; Ichiro Mori, both of Yokohama, Japan; Tsuyoshi Shibata, Fishkill, N.Y.

[73] Assignee: Kabushiki Kaisha Toshiba, Kawasaki, Japan

[21] Appl. No.: 204,438

[22] Filed: Mar. 2, 1994

[30] Foreign Application Priority Data

Mar. 3, 1993 [JP] Japan .................................. 5-42842
Sep. 20, 1993 [JP] Japan ................................. 5-233929
Dec. 28, 1993 [JP] Japan ................................. 5-354214

[51] Int. Cl.$^6$ ............................................. G03F 9/00
[52] U.S. Cl. ..................................... 430/5; 430/269; 430/311; 430/312
[58] Field of Search ................ 430/5, 269, 311, 312

[56] References Cited

U.S. PATENT DOCUMENTS 5,308,741  5/1994  Kemp .......................... 430/5

FOREIGN PATENT DOCUMENTS 61-292643 12/1986 Japan .
4-273427   9/1992 Japan .
4-355910 12/1992 Japan .
5-165223   7/1993 Japan .

Primary Examiner—S. Rosasco
Attorney, Agent, or Firm—Oblon, Spivak, McClelland, Maier, & Neustadt

[57] ABSTRACT

A method of transferring a micropattern onto a substrate includes the step of forming a multilayer film consisting of at least two layers on the substrate, the first exposing step of exposing the uppermost layer of the multilayer film through a first mask having a pattern equal to or larger than the micropattern, the step of positioning a second mask such that a main pattern thereof overlaps a transfer area of the uppermost layer of the multilayer film, the second mask having the main pattern corresponding to the micropattern and an auxiliary pattern arranged in the vicinity of the main pattern, and the second exposing step of exposing a layer other than the uppermost layer of the multilayer film through the second mask.

17 Claims, 12 Drawing Sheets

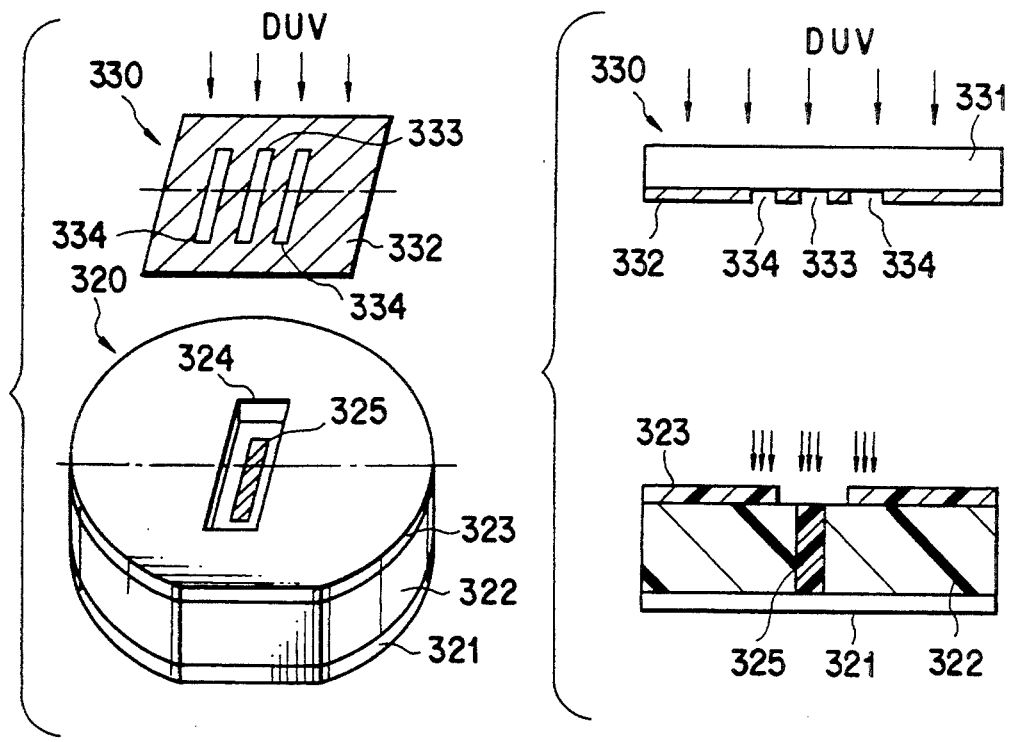
F I G. 6C   F I G. 7C
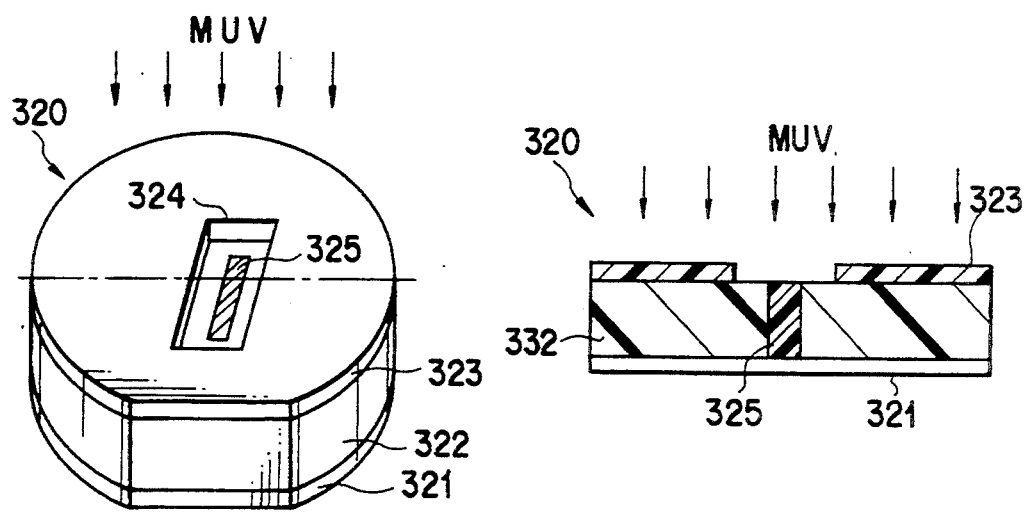
F I G. 6D   F I G. 7D

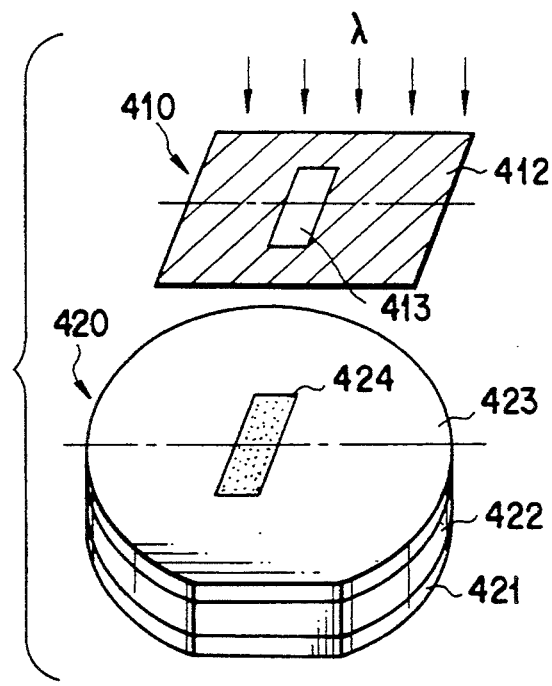
F I G. 8A
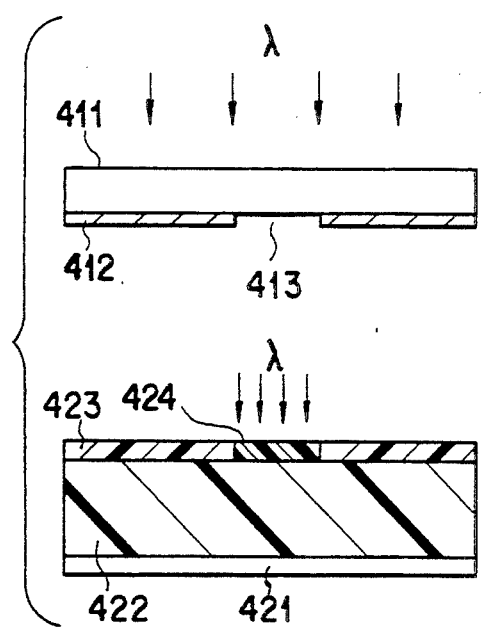
F I G. 9A
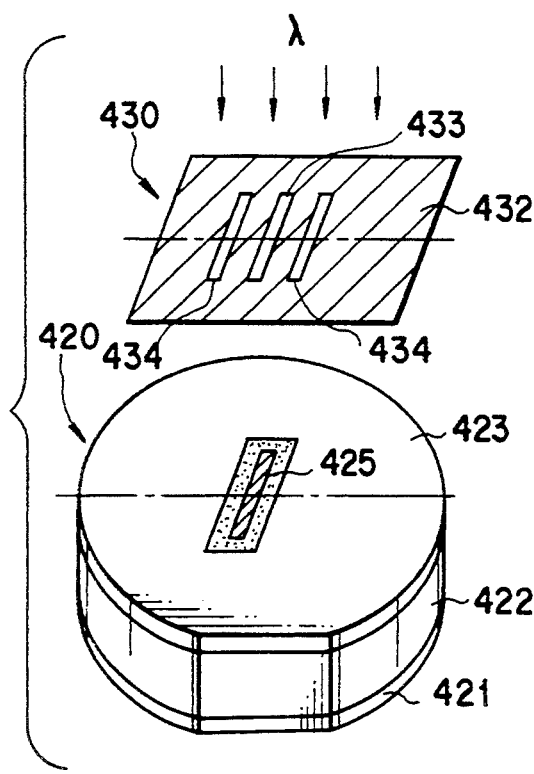
F I G. 8B
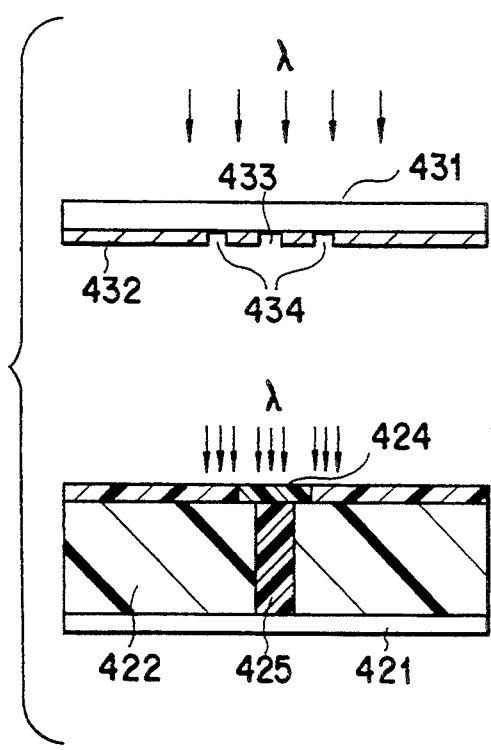
F I G. 9B

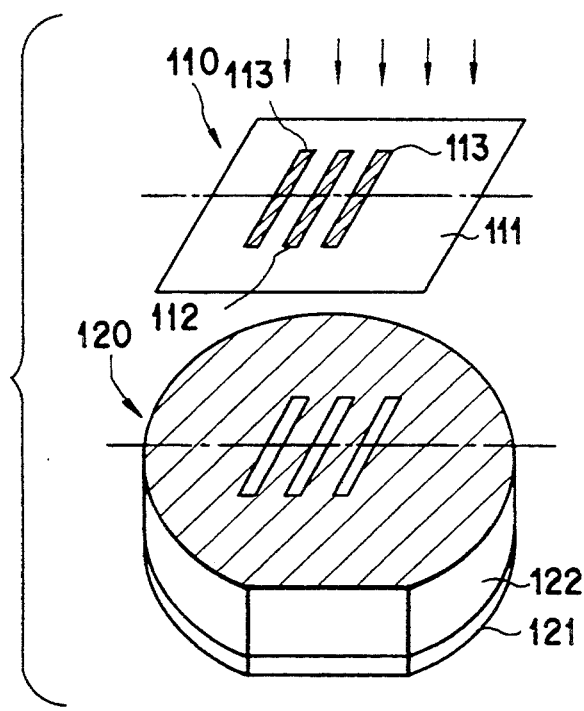
F I G. 10A
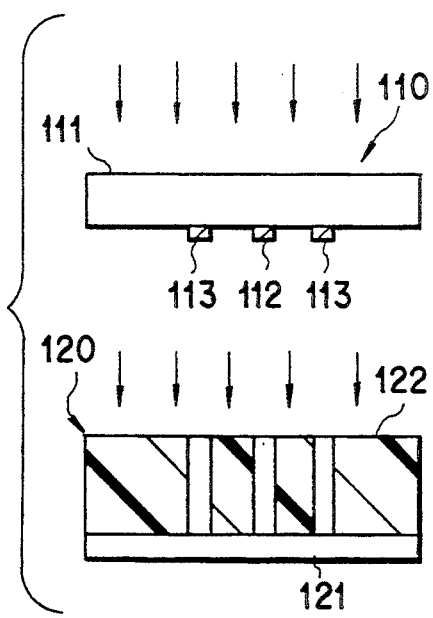
F I G. 11A
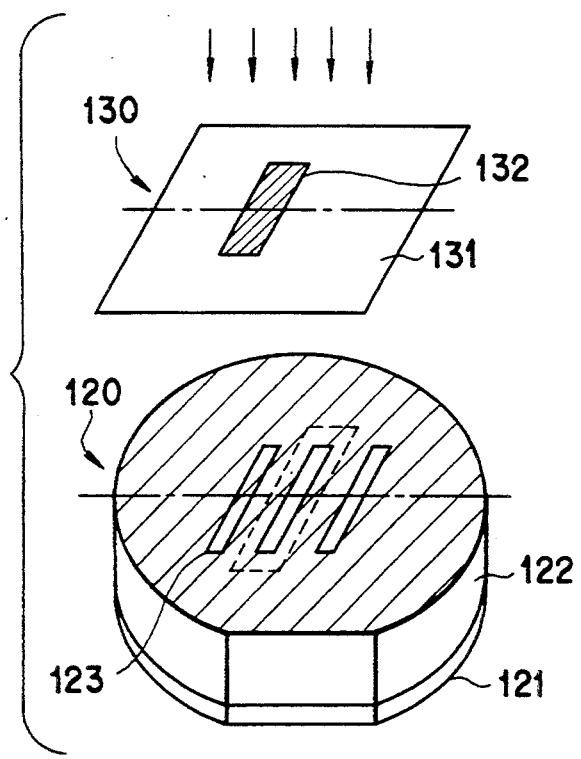
F I G. 10B
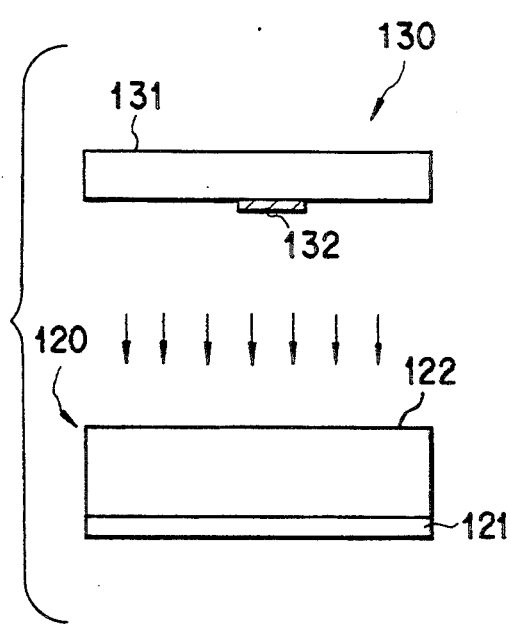
F I G. 11B

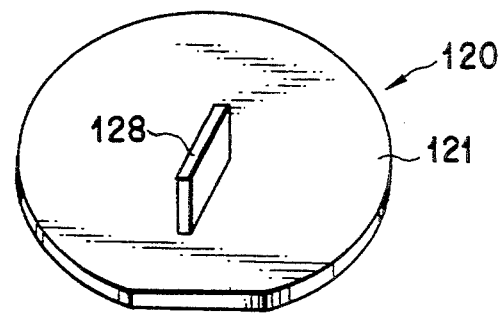
F I G. 12A
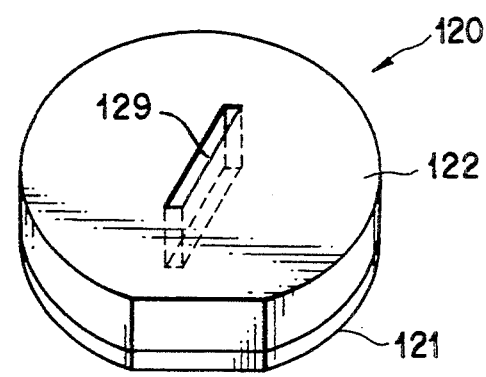
F I G. 12B
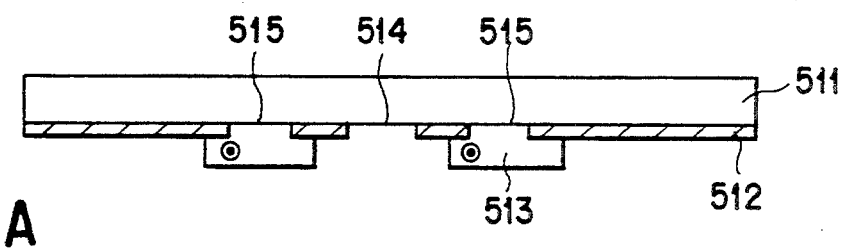
F I G. 13A
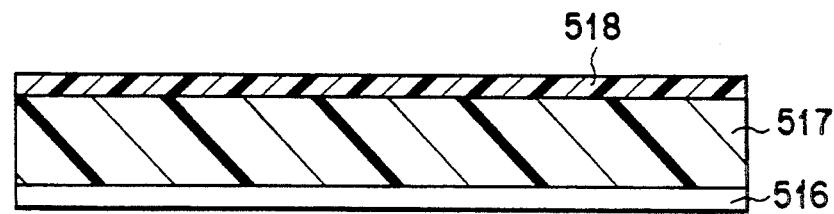
F I G. 13B

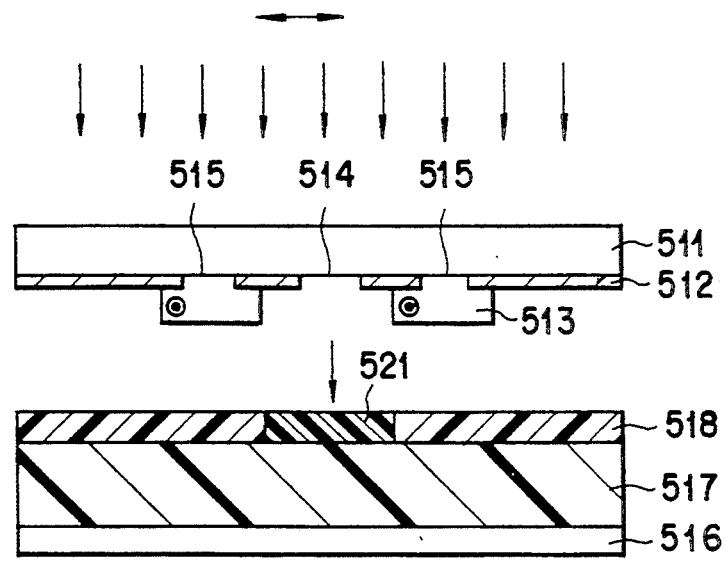
F I G. 14A
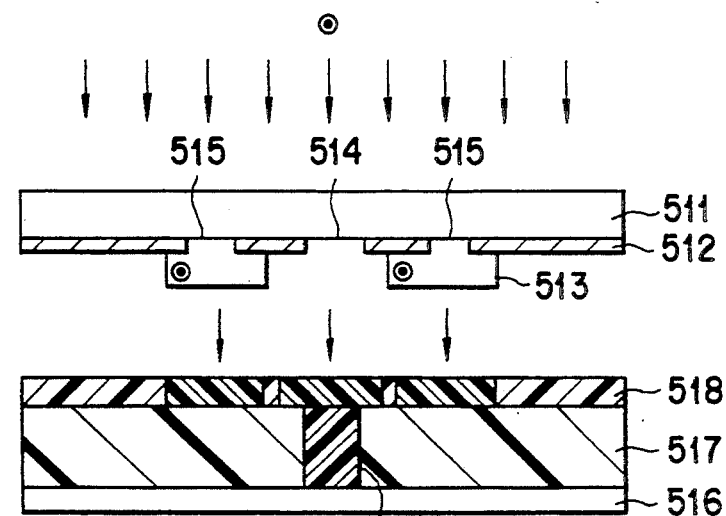
F I G. 14B
F I G. 14C

MICROPATTERN FORMING METHOD

BACKGROUND OF THE INVENTION

1. Field of the Invention

The present invention relates to a micropattern forming method using an exposure apparatus for the manufacture of a semiconductor device and, more particularly, to a micropattern forming method whose precision is improved by multi-exposure method.

2. Description of the Related Art

In a reduction projection exposure apparatus which illuminates, with an illumination system, a mask on which an original image pattern is drawn, and transfers the pattern of the mask onto a wafer, a reduction in the size of the pattern to be transferred is required. In order to satisfy this requirement, decrease in wavelength of the exposure light and increase in NA (Numerical Aperture) have been performed.

A conventional exposure apparatus will be described with reference to FIG. 1. Light from a light source 71 is focused by a first focusing optical system 72 comprising an elliptic reflecting mirror, an input lens, and the like, and is uniformed by a uniforming optical system 73 comprising an optical integrator and the like. An aperture 75 that determines the shape of the light source is arranged on the exit of the uniforming optical system 73. Light passing through the aperture 75 is focused by a second focusing optical system 76 comprising an output lens, a collimator lens, and the like, and is radiated on a mask 77. Light transmitted through the mask 77 is projected on a wafer 79 through a projection optical system 78.

In this arrangement, when the light-incident side is observed from the position of the mask 77, the nature of the light incident on this position is the same as that of the light emerging from the uniforming optical system 73 through the second focusing optical system 76, and the exit of the uniforming optical system 73 appears to be a light source. Therefore, in the above arrangement, an exit 74 of the uniforming optical system 73 is generally called as a secondary light source.

When the pattern of the mask 77 is projected on the wafer 79, the projection exposure pattern forming characteristics, i.e., the resolution, the depth of focus are determined by an exposure wavelength λ, NA of the projection optical system 78, and the shape of the aperture 75 that determines the nature of the secondary light source 74. Generally, a resolution r and a depth of focus D of an exposure apparatus are given by the following equation:

$$r = A1 \cdot \lambda / NA$$

$$D = A2 \cdot \lambda / NA^2$$

where A1 and A2 are parameters called process factors that are determined by the process conditions, the shape of the light source, and the like.

From these equations, it is apparent that in order to improve the resolution, the wavelength of the exposure light must be decreased and the NA must be increased. In this case, however, the depth of focus also decreases immediately.

It is known that in order to increase the depth of focus and improve resolution of a projection exposure apparatus, the phases of light transmitted through two adjacent transparent portions in a mask may be changed. Conventionally, a mask pattern that changes the phase of light transmitted through two adjacent transparent portions in a mask, called an alternating phase-shifting mask, is discussed in a literature entitled "Improving Resolution in Photolithography with a Phase-Shifting Mask" by Marc D. Levenson et al. in IEEE Trans on Electron Devices, Vol. ED-29 No. 12 (1982) p1828.

Typical examples of a mask structure and an exposing method for forming an optical image proposed in this literature will be described with reference to FIG. 2. A light-shielding film 82 is formed on a mask substrate 81, openings serving as the original image of the pattern are formed in the light-shielding film 82, and layers (to be referred to as shifters hereinafter) 83 for changing the phase of illumination light are formed on the opening regions. The shifters 83 are formed on every other one of adjacent openings regions. As the conditions of these shifters, a relation $$d = \lambda / \{2(n-1)\}$$

must be satisfied where d is the film thickness, n is the refractive index, and λ is the exposure wavelength. Light transmitted through openings around which the shifters are arranged and light transmitted through openings around which the shifters are not arranged have phases opposite from each other. Therefore, of the transmitted light, the light component corresponding to the pattern boundary has a light intensity of 0. In an image projected on a wafer 85 through a projection lens 84, the pattern has a clear contrast, thus improving the resolution.

When a negative resist as shown in FIG. 2 is used, a wiring pattern and the like can be formed. Note that a mask in which a desired resist pattern corresponds to an opening in this manner will be called a negative mask hereinafter. The above mask structure is a typical example and other various mask structures are also proposed. Even in other mask structures, image formation is performed in accordance with a similar optical principle. Reference numeral 86 in FIG. 2 denotes a resist pattern which is obtained by exposing a negative resist film to light through the above mask and developing the resultant structure.

In the periodic pattern represented by the above L/S pattern, shifters can be arranged around every other openings. However, in a pattern having an isolated opening, shifters cannot be arranged at optimum positions. Thus, as shown in FIGS. 3A to 3C, a method is proposed in which auxiliary openings 92 each having a line width less than the resolution limit are formed around an isolated opening 91, and a shifter is arranged on either the auxiliary openings 92 or the isolated opening 91, thereby improving the resolution (Jpn. Pat. Appln. KOKAI Publication No. 61-292643). After a resist film is exposed to a light pattern as shown in FIG. 3B through the mask shown in FIG. 3A, it is then developed as shown in FIG. 3C. A resist pattern 93 obtained in this manner has a very high resolution.

However, a method of this type has problems as follows. More specifically, the auxiliary patterns 92 must be formed as very thin patterns having a width less than the resolution limit so that they will not remain as resist patterns. Formation of such a mask imposes a heavy load. For example, when a device pattern having a minimum line width of 0.15 μm is to be exposed through a X4 magnification mask under conditions of NA=0.5 and exposure wavelength=248 nm, although the width of the main opening of the mask is 0.6 μm, the width of each auxiliary opening and the gap between the auxiliary opening and the main opening must be set to about 0.2 μm on the mask.

In this manner, conventionally, in a phase-shifting method for resolving a thin isolated pattern, auxiliary openings having a width less than the resolution limit, i.e., thinner than the main opening, must be formed around the main opening of the mask, leading to a remarkable difficulty in fabricating the mask. Furthermore, a difference occurs in resolution characteristics between a periodic pattern, e.g., an L/S (line and space) pattern, and an isolated pattern, not only when the phase-shifting method described above is employed but also when the size of a pattern to be resolved becomes close to the resolution limit. In an actual LSI pattern, a periodic pattern, e.g., an L/S pattern, and an isolated pattern are mixed. Hence, if the exposure conditions are such that the L/S pattern is resolved with the correct mask size, the isolated pattern is not resolved with the correct mask size.

SUMMARY OF THE INVENTION

It is an object of the present invention to provide a micropattern forming method capable of forming an isolated pattern with a high resolution which is the same as that for an L/S pattern without causing a difficulty in mask fabrication, which is thus suitable for formation of an LSI pattern.

According to the present invention, there is provided a method of transferring a micropattern onto a substrate, comprising:

the step of forming a multilayer film consisting of at least two layers on the substrate;

the first exposing step of exposing an uppermost layer of the multilayer film through a first mask having a pattern not smaller than the micropattern;

the step of positioning a second mask such that a main pattern thereof overlaps a transfer area of the uppermost layer of the multilayer film, the second mask having the main pattern corresponding to the micropattern and an auxiliary pattern arranged in the vicinity of the main pattern; and the second exposing step of exposing a layer other than the uppermost layer of the multilayer film through the second mask.

According to the present invention, there is also provided a method of transferring a micropattern onto a substrate, comprising:

the step of forming a photosensitive film on the substrate;

the first exposing step of exposing the photosensitive film through a first phase-shifting mask having a main pattern corresponding to the micropattern and an auxiliary pattern arranged in the vicinity of the main pattern;

the step of positioning a second phase-shifting mask having a pattern not smaller than the micropattern, such that the pattern of the second phase-shifting mask overlaps a transfer area of the main pattern on the photosensitive film; and the second exposing step of exposing the photosensitive film through the second mask.

Furthermore, according to the present invention, there is also provided an exposure mask comprising:

a transparent substrate; and a light-shielding film formed on the transparent substrate and having a main opening and a sub opening arranged in the vicinity of the main opening, wherein the sub opening has a polarization layer formed therein, and light transmitted through the main opening and light transmitted through the sub opening has a phase difference of $\pi(2n-1)$ where n is an integer and $\pi$ is the circle ratio.

Furthermore, according to the present invention, there is also provided a micropattern forming method for transferring, by using an exposure mask, a micropattern, formed on the exposure mask, onto a photosensitive substrate on which a multilayer film consisting of at least two layers is formed, the exposure mask comprising a transparent substrate and a light-shielding film formed on the transparent substrate and having a main opening and a sub opening arranged in the vicinity of the main opening, the sub opening having a polarization layer formed therein, and light transmitted through the main opening and light transmitted through the sub opening having a phase difference of $\pi(2n-1)$ where n is an integer and $\pi$ is the circle ratio, comprising:

the first exposing step of exposing the photosensitive substrate with first polarization light having a component perpendicular to a direction of polarization of the polarization layer through the exposure mask; and the second exposing step of exposing the photosensitive substrate with second polarization light having a component parallel to the direction of polarization through the exposure mask.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIGS. 6A to 6D are perspective views showing a micropattern forming step according to Embodiment 2;

FIGS. 7A to 7D are sectional views of FIGS. 6A to 6D, respectively;

FIGS. 8A to 8D are perspective views showing a micropattern forming step according to Embodiment 3;

FIGS. 9A to 9D are sectional views of FIGS. 8A to 8D, respectively;

FIGS. 10A and 10B are perspective views showing a micropattern forming step according to Embodiment 4;

FIGS. 11A and 11B are sectional views of FIGS. 10A and 10B, respectively;

FIGS. 12A and 12B are perspective views of patterns obtained by Embodiment 4;

FIG. 13A is a sectional view showing the arrangement of an exposure mask used in Embodiment 5;

FIG. 13B is a sectional view showing the arrangement of a photosensitive substrate used in Embodiment 5; and FIGS. 14A to 14C are sectional views showing a micropattern forming step according to Embodiment 5.

DETAILED DESCRIPTION OF THE PREFERRED EMBODIMENTS

Figure 1:
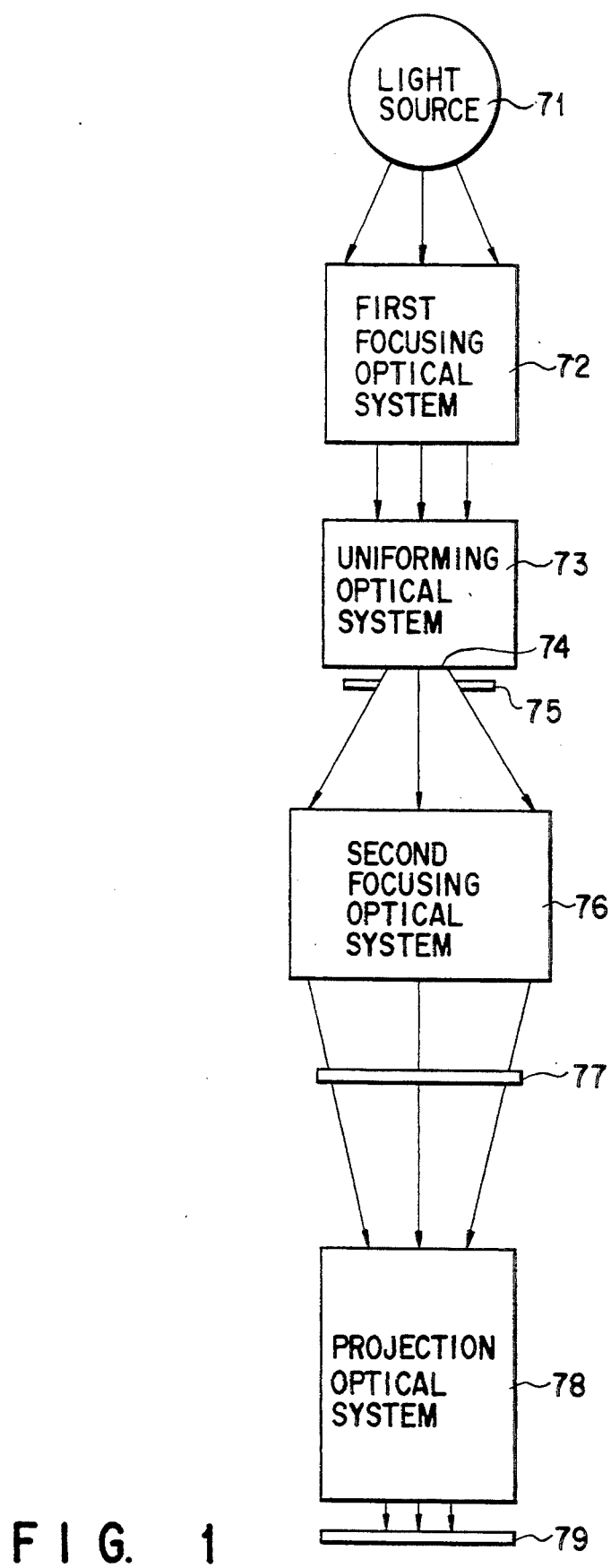
FIG. 1 is a diagram showing the schematic arrangement of a conventional reduction projection exposure apparatus.
Figure 2:
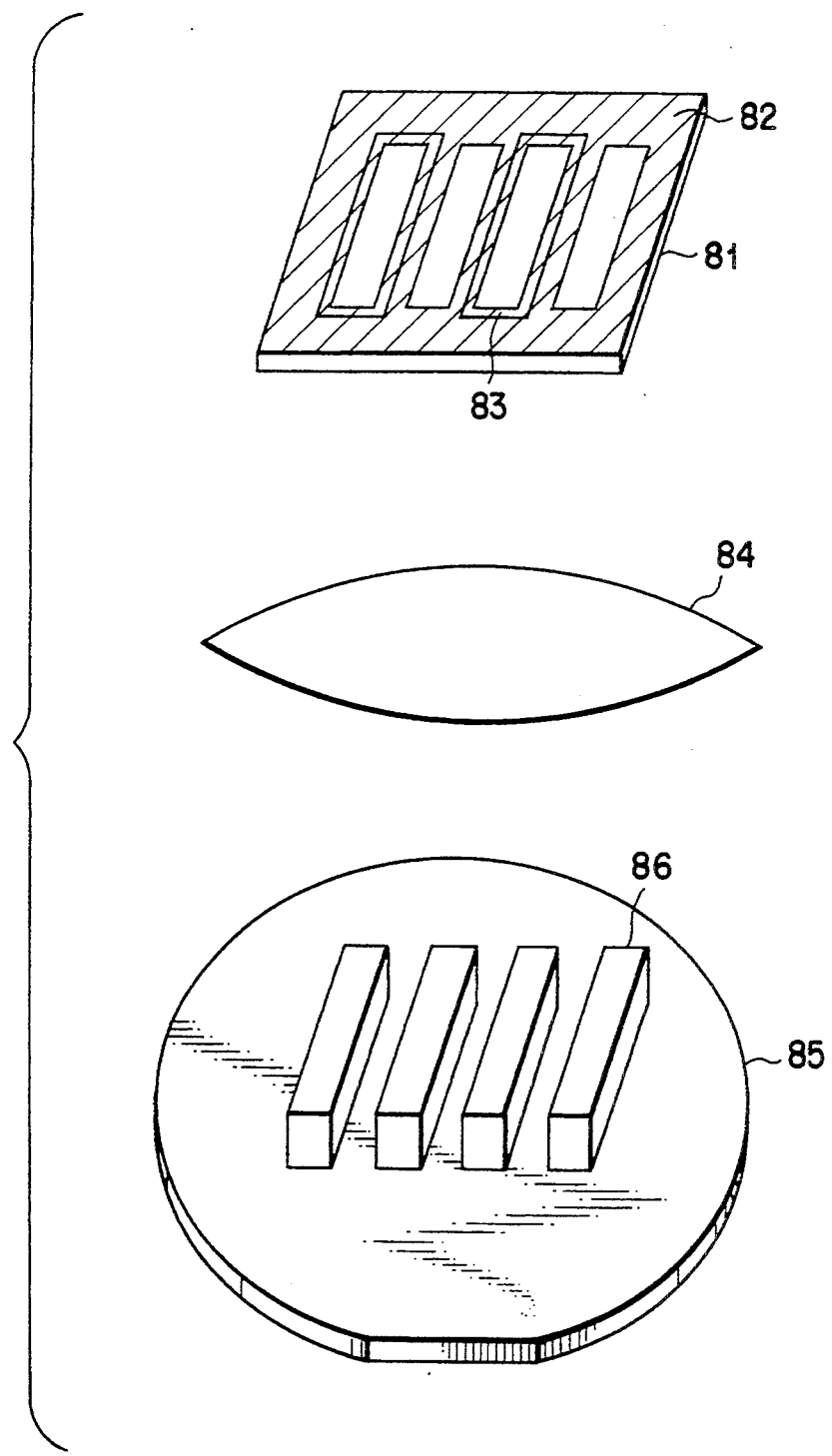
FIG. 2 includes views showing typical examples of a mask structure for forming an optical image and an exposing method.
Figure 3A:
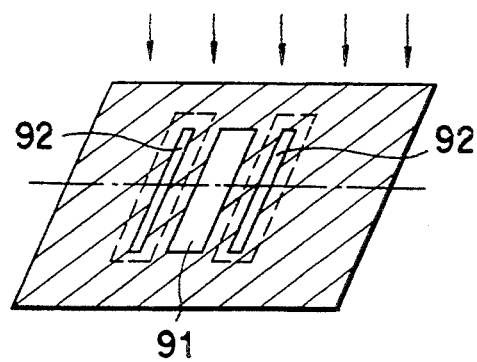
FIGS. 3A to 3C are views showing a case wherein pattern transfer is performed by using a mask in which auxiliary openings are formed in the vicinity of an isolated opening.
Figure 3B:
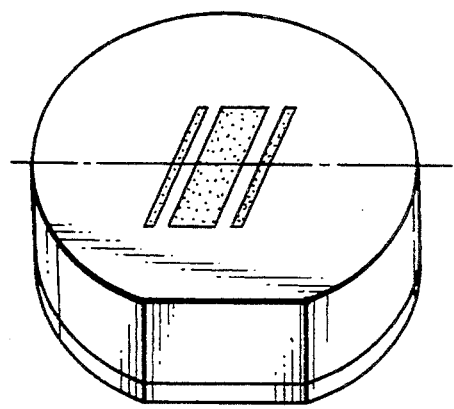
Figure 3C:
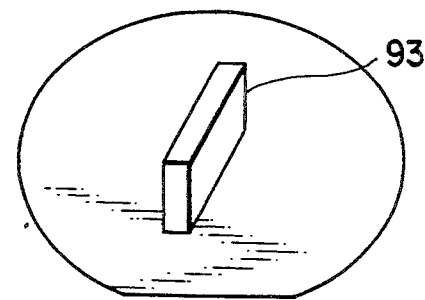

According to the first aspect of the present invention, there is provided a method of transferring a micropattern onto a substrate, comprising the step of forming a multilayer film consisting of at least two layers on the substrate, the first exposing step of exposing an uppermost layer of the multilayer film with first light through a first mask having a pattern not smaller than the micropattern, the step of positioning a second mask such that a main pattern thereof overlaps a transfer area of the uppermost layer of the multilayer film, the second mask having the main pattern corresponding to the micropattern and an auxiliary pattern arranged in the vicinity of the main pattern, and the second exposing step of exposing the multilayer film or films other than the uppermost layer of the multilayer film with second light through the second mask.

In the above method, the respective patterns formed in the masks may be light-shielding patterns formed on a light-transmitting or transparent substrate.

As the masks, the following masks can be preferably used:

(1) A halftone phase-shifting mask formed such that it has at least a region translucent to exposure light and a region transparent to exposure light on a transparent substrate and that the phase difference between light transmitted through the transparent and translucent regions is about 180°.

(2) An alternating phase-shifting mask formed such that it has at least a region non-transparent to exposure light and a region transparent to exposure light on a transparent substrate, that the transparent and nontransparent regions are alternately repeated to form a periodic pattern area, and that the phase difference between light transmitted through adjacent transparent regions in the periodic pattern area is about 180°.

If these phase-shifting masks are not used, during exposure by using first and second masks, an illumination scheme so-called an oblique illumination scheme wherein a light source that illuminates the masks has a higher intensity at its peripheral portion than at its central portion may be employed, thereby obtaining the same effect as that of the present invention.

As a photosensitive material on the substrate, materials having the following structures can be used:

(1) A two-layer structure consisting of a second photosensitive material layer having sensitivity to at least a second wavelength and a first photosensitive material layer formed on the second photosensitive material layer and having sensitivity to a first wavelength. In this case, an exposing step using the first mask may be performed by employing the light of the first wavelength, then an exposing step using the second mask may be performed by employing the light of the second wavelength, and thereafter a developing step may be performed.

(2) A two-layer structure consisting of a photosensitive material layer having a sensitivity to an exposure wavelength and a material layer formed on the photosensitive material layer and having a large bleaching effect (wherein the transmittance at the portion illuminated with the exposure light is increased) against the exposure wavelength. In this case, an exposing step using the first mask may be performed, then an exposing step using the second mask may be performed, and thereafter a developing step may be performed.

Furthermore, the first aspect of the present invention can be modified in the following manner:

(1) It may include, before the developing step, a step of reversing a portion to be developed and a portion not to be developed, or it may include, after the developing step, the step of reversing the developed pattern on the photosensitive substrate.

(2) It may include, after the exposing step using the first mask and before the exposing step using the second mask, the step of developing or etching the exposure portion or non-exposure portion of the uppermost layer of the multilayer film.

According to the first aspect of the present invention described above, pattern transfer using the first mask plays a role of cancelling the influence of the auxiliary pattern of the second mask to the resist in a later step. In pattern transfer using the second mask, a pattern can be transferred with a high resolution in the same manner as an L/S pattern by arranging an auxiliary pattern having almost the same size as the main pattern around the isolated pattern. At this time, since the auxiliary pattern can have the same size as the main pattern, the difficulty in mask fabrication are not increased by auxiliary pattern formation.

More specifically, when pattern transfer is performed by using the second mask, the main pattern can be transferred with a high resolution in the same manner as the L/S pattern, and transfer of the auxiliary pattern can be prohibited by pattern transfer using the first mask. Accordingly, when pattern transfer is performed twice by using the first and second masks, the isolated pattern can be transferred with a high resolution in the same manner as the L/S pattern.

According to the second aspect of the present invention, there is provided a method of transferring a micropattern onto a substrate, comprising the step of forming a photosensitive film on the substrate, the first exposing step of exposing the photosensitive film through a first phase-shifting mask having a main pattern corresponding to the micropattern and an auxiliary pattern arranged in the vicinity of the main pattern, the step of positioning a second phase-shifting mask having a pattern not smaller than the micropattern, such that the pattern of the second phase-shifting mask overlaps a transfer area of the photosensitive film, and the second exposing step of exposing the photosensitive film through the second mask.

As the first and second phase-shifting masks used in the second aspect of the present invention, the halftone phase-shifting mask and the alternating phase-shifting mask described above can be used.

According to the second aspect of the present invention, the same effect as that of the first aspect can be obtained.

According to the third aspect of the present invention, there is provided an exposure mask comprising a transparent substrate, and a light-shielding film formed on the transparent substrate and having a main opening and sub openings arranged in the vicinity of the main opening, wherein the sub openings have polarization layers formed therein, and light transmitted through the main opening and light transmitted through the sub openings has a phase difference of $\pi(2n-1)$ where n is an integer and $\pi$ is the circle ratio.

According to the fourth aspect of the present invention, a micropattern forming method using this exposure mask is provided. More specifically, according to the fourth aspect of the present invention, there is provided a micropattern forming method for transferring, by using an exposure mask, a micropattern, formed on the exposure mask, onto a photosensitive substrate on which a multilayer film consisting of at least two layers is formed, the exposure mask comprising a transparent substrate and a light-shielding film formed on the transparent substrate and having a main opening and sub openings arranged in the vicinity of the main opening, the sub openings having a polarization layers formed therein, and light transmitted through the main opening and light transmitted through the sub openings having a phase difference of $\pi(2n-1)$ where n is an integer, comprising the first exposing step of exposing the photosensitive substrate to first polarization light having a component perpendicular to a direction of polarization of the polarization layers through the exposure mask, and the second exposing step of exposing the photosensitive substrate to second polarization light having a component parallel to the direction of polarization through the exposure mask.

As the photosensitive substrate, one having a multilayer film consisting of a photosensitive material layer having sensitivity to an exposure wavelength and a material layer formed on the photosensitive material layer and having a large bleaching effect against the exposure wavelength is preferable.

According to the third and fourth aspects of the present invention, in the first exposing step, since the exposure light is shielded at the sub opening and the exposure light is transmitted only through the main opening, exposure is performed only through the main opening. More specifically, the pattern of the main opening is exposed to the photosensitive material. At this time, if the photosensitive substrate has a material layer consisting of a material having a large bleaching effect on a photosensitive resin layer, part of the material layer becomes transparent in accordance with the pattern of the main opening. In the second exposing step, since the exposure light is transmitted both through the main and sub openings, an image of a pattern having a width less than the resolution limit can be formed. At this time, due to the presence of the above material layer, only a portion of the photosensitive resin layer located below a portion of the material layer which becomes transparent by the first exposing step is photosensitized, so that a portion of the photosensitive resin layer corresponding to the sub opening is not photosensitized. In other words, only the pattern corresponding to the main opening is exposed with a high resolution.

Accordingly, as in the first and second aspects of the present invention, the main pattern can be transferred with a high resolution in the same manner as the L/S pattern, and transfer of the auxiliary pattern can be prohibited. Since the exposure mask need not be exchanged, an overlay error does not occur in the two exposing steps, and the pattern precision can be further improved. The photosensitive substrate need not be one having providing a material layer exhibiting a high bleaching effect on a photosensitive resin layer, and one which is the same as that used in the first aspect of the present invention may be used.

various embodiments of the present invention will be described with reference to the accompanying drawings.

Embodiment 1

This embodiment relates to formation of an isolated line pattern by using a negative mask and a negative resist. FIGS. 4A to 4D are conceptual perspective views of a mask and a substrate to be exposed showing the steps of this embodiment. FIGS. 5A to 5D on the right side of FIGS. 4A to 4D are sectional views of portions indicated by an alternate long-and-short-dash line in FIGS. 4A to 4D, respectively.

Figure 4A:
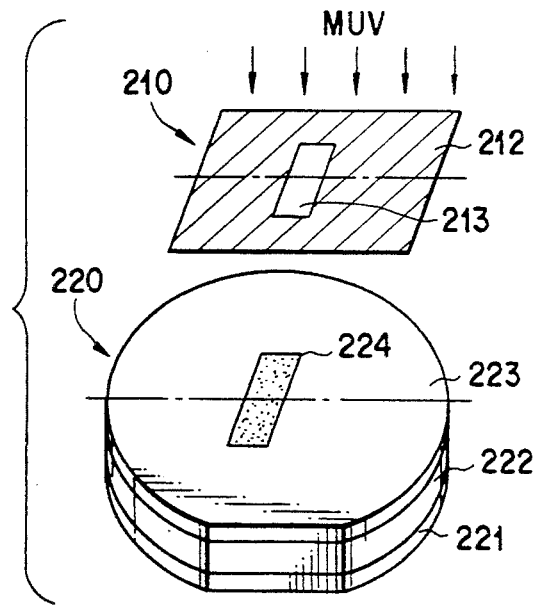
FIGS. 4A to 4D are perspective views showing a micropattern forming step according to Embodiment 1.
Figure 5A:
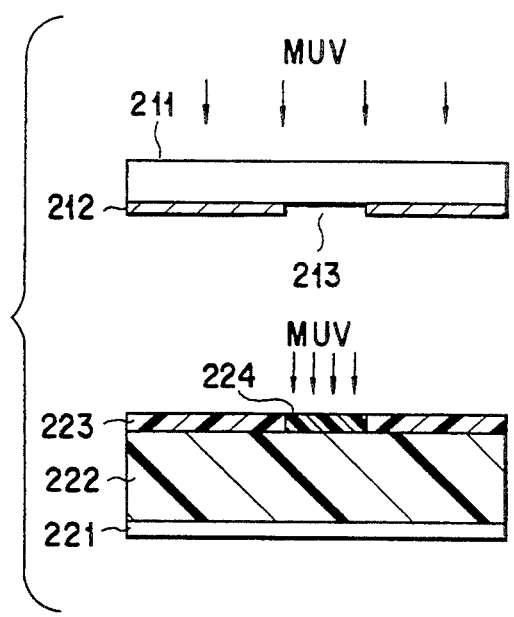
FIGS. 5A to 5D are sectional views of FIGS. 4A to 4D, respectively.

As shown in FIGS. 4A and 5A, a mask (first mask) 210 used in the first pattern transfer step is obtained by forming a light-shielding film 212 on the surface of a transparent substrate 211 and forming an opening 213 in a portion of the light-shielding film 212. Substrate 20 to be exposed is obtained by forming a negative resist layer (DUV resist layer) 222, which is photosensitive to the DUV (deep ultraviolet rays) light, on a wafer 221, and then forming a positive resist layer (MUV resist layer) 223 on the negative resist layer 222. A DUV negative resist usually does not have sensitivity to the MUV (mid ultraviolet rays) light. The positive resist layer 223 contains a photosensitizer having sensitivity to MUV. As the resin, a material having a high transparency to DUV is preferably used.

when the substrate 220 is exposed to the MUV light through the mask 210, a portion 224 corresponding to the opening 213 is photosensitized, so that the photosensitizer is decomposed and the portion 224 becomes transparent to the DUV light.

Figure 4B:
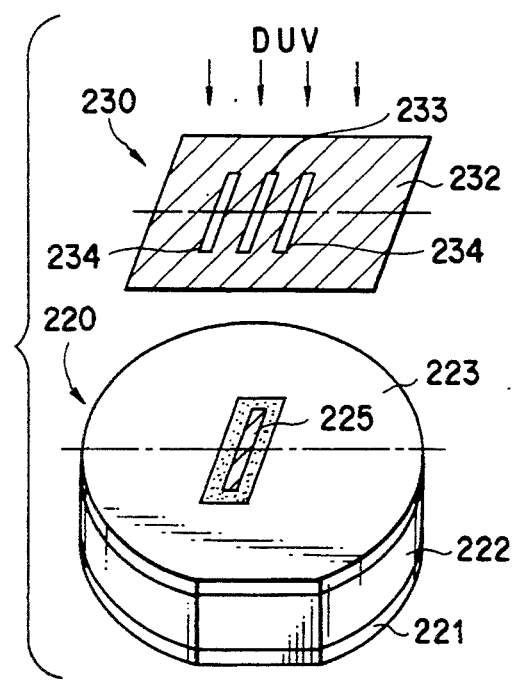
Figure 5B:
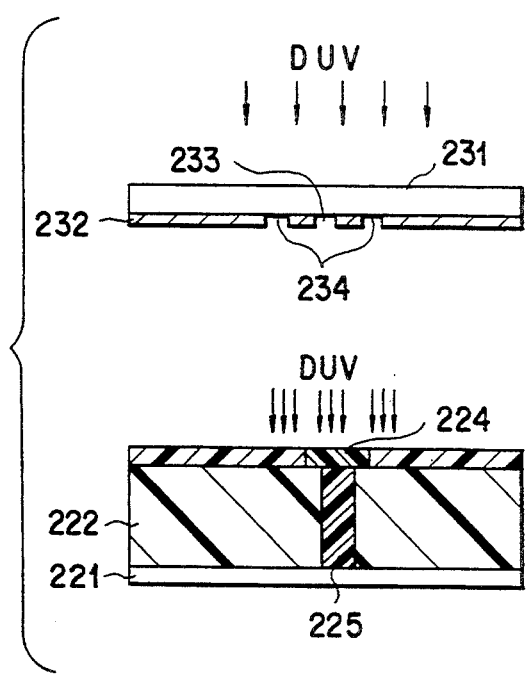

As shown in FIGS. 4B and 5B, a mask (second mask) 230 used in the second pattern transfer step is obtained by forming a light-shielding film 232 on the surface of a transparent substrate 231 and forming an opening (main pattern) 233 corresponding to the prospective final desired isolated line pattern and openings (auxiliary patterns) 234 having almost the same line width as that of the opening 233 in a portion of the light-shielding film 232.

The mask 230 and the substrate 220 are aligned such that an image obtained by the opening 233 is formed in the exposure portion 224, and exposure is performed with the DUV light. Then, since only the exposure portion 224 irradiated with the MUV light is transparent to the DUV light, only an image intensity distribution corresponding to the isolated pattern 233 is transmitted to the DUV resist layer 222, and a portion 225 is photosensitized. Image intensity distributions from other patterns 234 are blocked by the MUV resist layer 223 and do not reach the DUV resist layer 222.

Figures 4C, 5C:
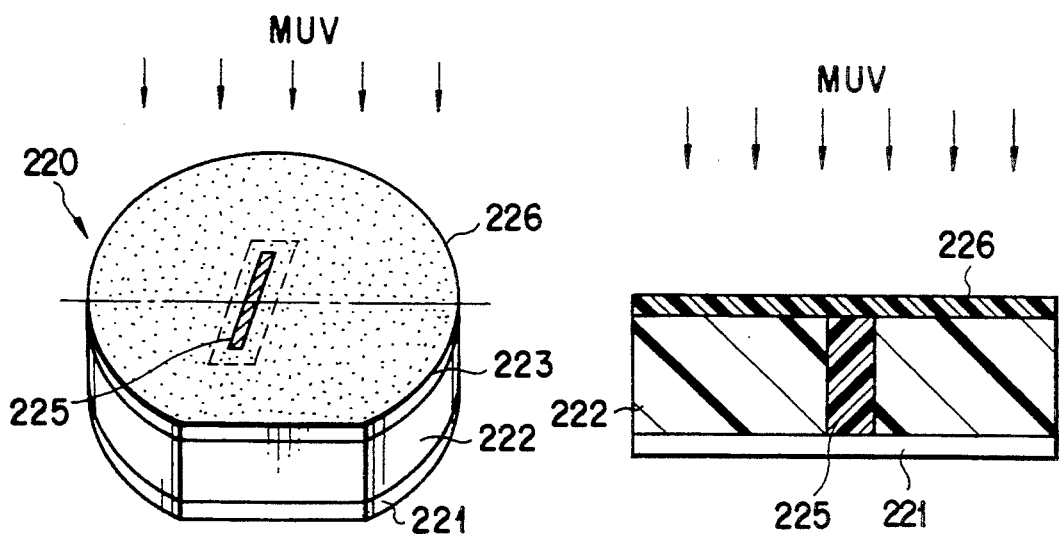
Figures 4D, 5D:
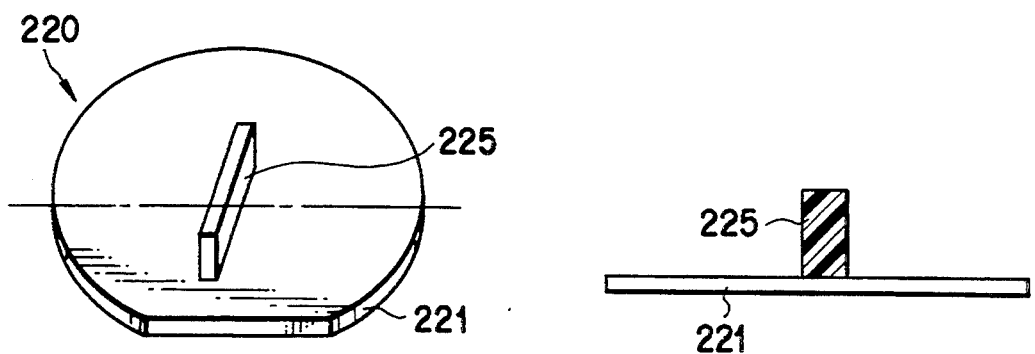

The next step is a pre-step for development, as shown in FIGS. 4C and 5C. The entire surface of the obtained structure is exposed to the MUV light to totally photosensitize the MUV resist layer 223, so that the MUV resist layer 223 becomes soluble by an alkali developing solution or the like. Thereafter, development is performed with the alkali developing solution or the like. Then, only the portion 225 of the DUV resist layer 222 photosensitized by the DUV light remains, as shown in FIGS. 4D and 5D, thereby forming a desired isolated line pattern.

In this embodiment, a phase-shifting mask in which a halftone phase shifter is arranged in place of the light-shielding film 212 may be used as a mask 210. Other phase-shifting masks, e.g., a self-alignment phase-shifting mask, may also be used. A Levenson phase-shifting mask in which a shifter or shifters are provided to either an opening 233 or openings 234 may be used as a mask 230. Also, a halftone phase shifter may be arranged in place of the light-shielding film 232 as a mask 230.

In this embodiment, the openings 234 are arranged one on each side of the opening 233. However, the present invention is not limited to this, and two or more openings 234 may be arranged, and alternatively an opening may surround an opening 233. An opening 234 must exist around the opening 233 to such a degree that the opening 233 does not stand as an isolated opening. Furthermore, as an illumination scheme in the first and second pattern transfer steps, an oblique illumination scheme represented by an annular illumination scheme or an illumination scheme in which light is radiated from four regions remote from the optical axis may be employed.

In this embodiment, when a positive resist is used in place of the negative resist layer 222, an isolated space pattern and an isolated contact hole pattern can be formed. In this case, after the second pattern transfer step is completed, an image reversal step is performed to perform development, so that the resist pattern is reversed, thereby forming an isolated line pattern.

In this embodiment, two resist layers are used. However, the same effect as that obtained in this embodiment can also be realized by a single resist layer when a resist which causes bleaching upon being exposed to the MUV light (has a low transmittance for the DUV light) and is photosensitive only to the DUV light is used.

Embodiment 2

This embodiment relates to formation of an isolated line pattern by using a negative mask and a negative resist. FIGS. 6A to 6D are conceptual perspective views of a mask and an exposure substrate showing the steps of this embodiment. FIGS. 7A to 7D on the right side of FIGS. 6A to 6D are sectional views of portions indicated by an alternate long-and-short-dash line in FIGS. 6A to 6D, respectively.

Figure 6A:
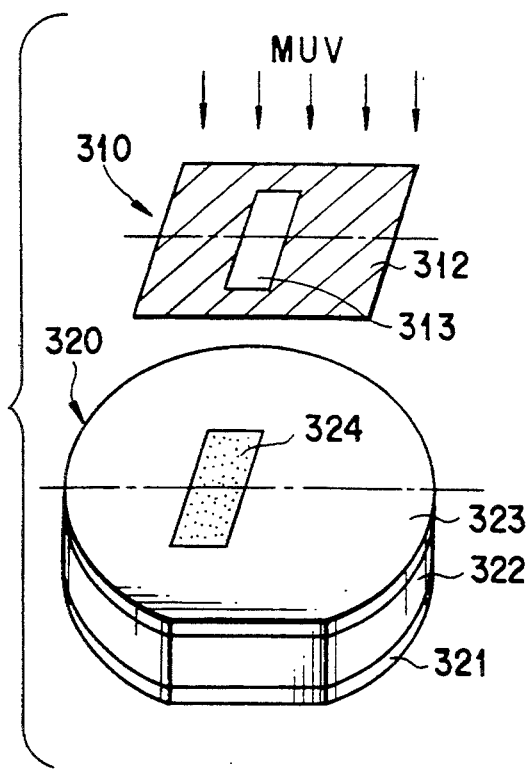
Figure 7A:
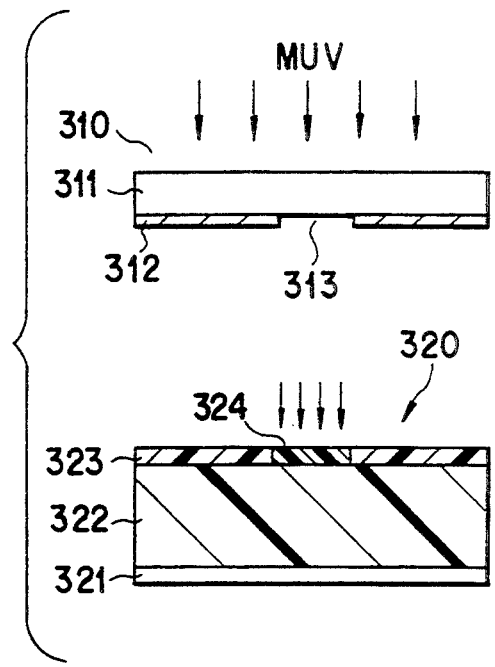

As shown in FIGS. 6A and 7A, a mask (first mask) 310 used in the first pattern transfer step is obtained by forming a light-shielding film 312 on the surface of a transparent substrate 311 and forming an opening 313 in a portion of the light-shielding film 312. Substrate 320 to be exposed is obtained by forming a negative resist layer (DUV resist layer) 322, which is photosensitive to the DUV light, on a wafer 321, and then forming a positive resist layer (MUV resist layer) 323 on the negative resist layer 322. A DUV negative resist usually does not have sensitivity to the MUV light. A resist insoluble in an alkali developing solution is selected as the negative resist layer 322.

Figure 6B:
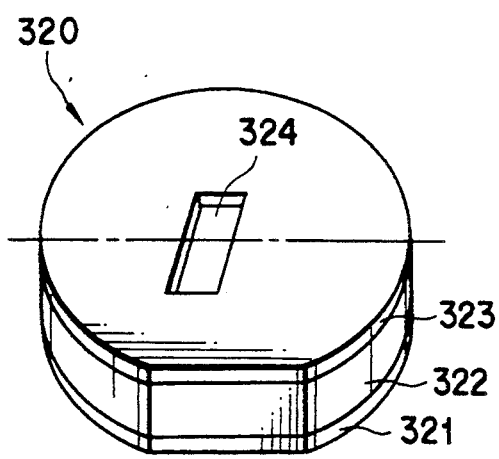
Figure 7B:
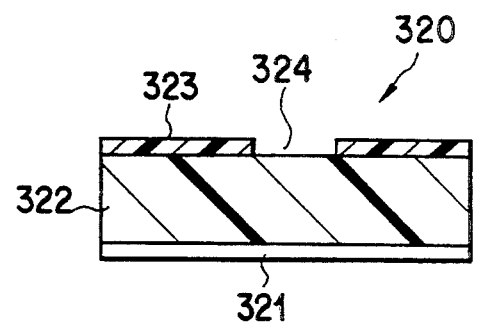

When the substrate 320 is exposed to the MUV light through the mask 310, a portion 324 corresponding to the opening 313 is photosensitized. Subsequently, alkali development is performed as shown in FIGS. 6B and 7B, so that only the photosensitized portion 324 is dissolved.

As shown in FIGS. 6C and 7C, a mask (second mask) 330 used in the second pattern transfer step is obtained by forming a light-shielding film 332 on the surface of a transparent substrate 331 and forming an opening (main pattern) 333 corresponding to the prospective final desired isolated line pattern and openings (auxiliary patterns) 334 having almost the same line width as that of the opening 333 in a portion of the light-shielding film 332.

The mask 330 and the substrate 320 are aligned such that only an image obtained by the opening 333 is formed in the portion 324, and exposure is performed with the DUV light. Then, only an image intensity distribution corresponding to the main pattern 333 is transmitted to the DUV resist layer 322, and a portion 325 is photosensitized. Image intensity distributions from other patterns 334 are blocked by the MUV resist layer 323 and do not reach the DUV resist layer 322.

The step shown in FIGS. 6D and 7D is a pre-step for development. The entire surface of the obtained structure is exposed to the MUV light to totally photosensitize the MUV resist layer 323, so that the MUV resist layer 323 becomes soluble in an alkali developing solution or the like. Thereafter, when development is performed with the alkali developing solution or the like, the MUV resist layer 323 is removed. Then, organic development is performed, and only the portion 325 of the DUV resist layer 322 photosensitized by the DUV light remains, thereby forming a desired isolated line pattern.

In this embodiment, phase-shifting masks in which halftone phase shifters are arranged in place of the light-shielding films 312 and 332 may be used as masks 310 and 330. Other phase-shifting masks, e.g., self-alignment phase-shifting masks, may also be used. An alternating phase-shifting mask in which a shifter or shifters are provided to either an opening 333 or openings 334 may be used as a mask 330. Also, a halftone phase shifter may be arranged in place of the light-shielding film 232 as a mask 230.

In this embodiment, the openings 334 are arranged one on each side of the opening 333. However, the present invention is not limited to this, and two or more openings 334 may be arranged, and alternatively an opening may surround an opening 333. An opening 334 must exist around the opening 333 to such a degree that the opening 333 does not stand as an isolated opening. Furthermore, as an illumination scheme in the first and second pattern transfer steps, an oblique illumination scheme represented by an annular illumination scheme may be employed.

In this embodiment, when a positive resist is used in place of the negative resist layer 322, an isolated space pattern and an isolated contact hole pattern can be formed. In this case, after the developing step shown in FIGS. 6B and 7B is completed, an image reversal step is performed to perform development, so that the resist pattern is reversed, thereby forming an isolated line pattern.

In this embodiment, two resist layers are used. However, the same effect as that obtained in this embodiment can also be realized by a single resist layer when a resist which causes bleaching upon being exposed to the MUV light (has a low transmittance for the DUV light) and is photosensitive only to the DUV light is used.

Embodiment 3

This embodiment relates to formation of an isolated line pattern by using a negative mask and a negative resist. FIGS. 8A to 8D are conceptual perspective views of a mask and substrate to be exposed showing the steps of this embodiment. FIGS. 9A to 9D on the right side of FIGS. 8A to 8D are sectional views of portions indicated by an alternate long-and-short-dash line in FIGS. 8A to 8D, respectively.

As shown in FIGS. 8A and 9A, a mask (first mask) 410 used in the first pattern transfer step is obtained by forming a light-shielding film 412 on the surface of a transparent substrate 411 and forming an opening 413 in a portion of the light-shielding film 412. Substrate 420 to be exposed is obtained by forming a negative resist (resist layer) 422, which is photosensitive to the exposure light, on a wafer 421, and then forming a layer (CEL (Contrast Enhancement Lithography) layer) 423 made of a material having a large bleaching effect against the exposure light on the negative resist 422. In the CEL layer 423, the transmittance of the exposure light increases as the exposure time passes.

Regarding the material of the CEL layer, an aromatic nitron compound, diazonium salt, and the like are effective for g-lines (436 nm). More specifically, 2,5-diethoxy-4-morpholinophenyldiazoniumparatoluenesulfonate, 4-phenylaminonaphthyldiazoniumsulfonate, 4-N-N'-dimethylaminonaphthyldiazonium-3-carboxy-4-hydroxyphenylsulfonate, and the like are effective. The aromatic nitron compound, diazonium salt, and the like are also effective as the material of the CEL layer for i-lines (365 nm). More specifically, 2-ethoxy-4-NN'diethylphenyldiazoniumparatoluenesulfonate, 4-NN'dimethylaminophenyldiazoniumparatoluenesulfonate, 4-morpholinophenyldiazonium-3-carboxy-4-hydroxyphenylsulfonate, and the like are effective. A pyridine oxide, a diazo-compound, and the like are effective as the material for a KrF excimer laser (248 nm). The chemical formulae (1) to (3) of the material for g-lines and the chemical formulae (4) to (6) of the material for i-lines are described below.

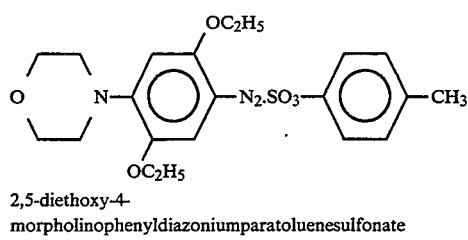

2,5-diethoxy-4-morpholinophenyldiazoniumparatoluenesulfonate (1)

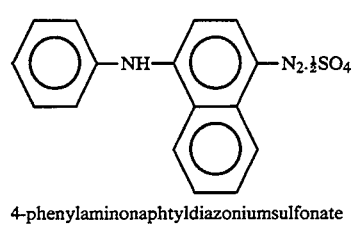

4-phenylaminonaphtyldiazoniumsulfonate (2)

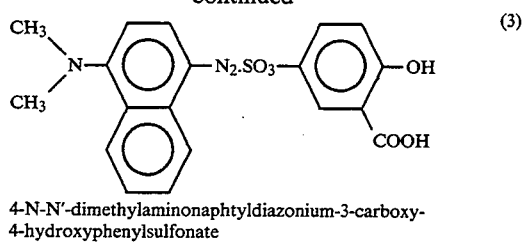

4-N-N'-dimethylaminonaphtyldiazonium-3-carboxy-4-hydroxyphenylsulfonate (3)

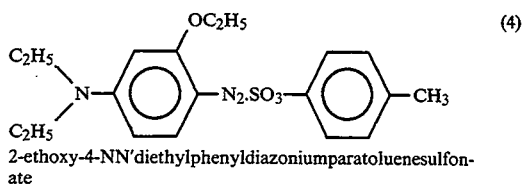

2-ethoxy-4-NN'diethylphenyldiazoniumparatoluenesulfonate (4)

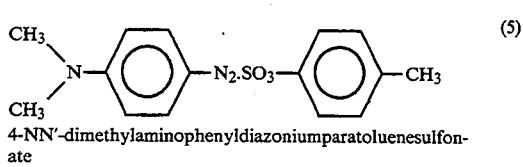

4-NN'-dimethylaminophenyldiazoniumparatoluenesulfonate (5)

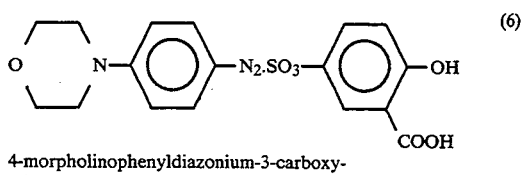

4-morpholinophenyldiazonium-3-carboxy-4-hydroxyphenylsulfonate (6)

when the substrate 420 is exposed to an exposure wavelength (λ) light through the mask 410, a portion 424 corresponding to the opening 413 causes bleaching to become transparent to the exposure wavelength (λ).

As shown in FIGS. 8B and 9B, a mask (second mask) 430 used in the second pattern transfer step is obtained by forming a light-shielding film 432 on the surface of a transparent substrate 431 and forming an opening (main pattern) 433 corresponding to the prospective final desired isolated line pattern and openings (auxiliary patterns) 434 having almost the same line width as that of the opening 433 in a portion of the light-shielding film 432.

The mask 430 and the substrate 420 to be exposed are aligned such that an image obtained by the opening 433 is formed in the exposure portion 424, and exposure is performed. Then, since only the exposure portion 424 is transparent to the exposure wavelength (λ), only an image intensity distribution corresponding to the isolated pattern 433 is transmitted to the resist layer 422, and a portion 425 is photosensitized. Image intensity distributions from other patterns 434 are blocked by the CEL resist layer 423 and do not reach the resist layer 422, or even if they do, they are weak.

Figure 8C:
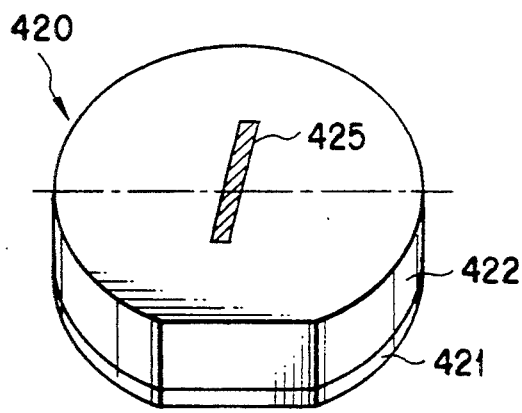
Figure 9C:
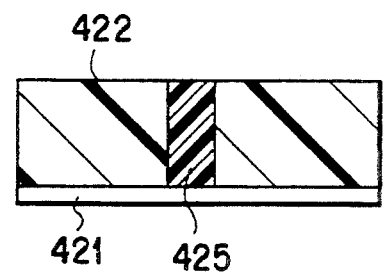
Figure 8D:
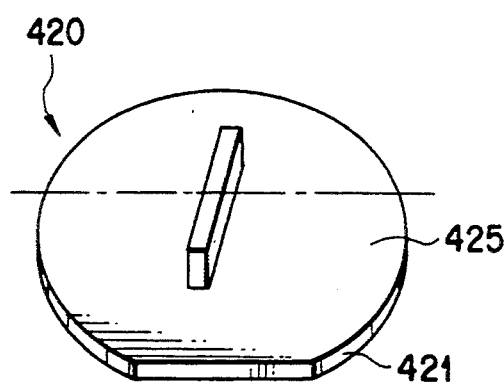
Figure 9D:
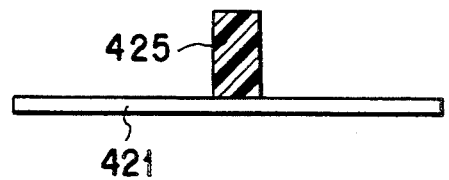

The next step is a pre-step for development, as shown in FIGS. 8C and 9C. Since the CEL layer is usually water-soluble, it can be easily removed by water. Thereafter, development is performed with an alkali developing solution or the like, so that only the portion 425 of the resist layer 422 photosensitized by the exposure wavelength (λ) remains, as shown in FIGS. 8D and 9D, thereby forming a desired isolated line pattern.

A CEL layer which is soluble in the alkali developing solution is also available. In this case, the CEL layer and the resist layer can be dissolved simultaneously. A CEL layer which is soluble in an organic solvent is also available. In this case, the CEL layer is removed by the organic solvent in the above step.

In this embodiment, a phase-shifting mask in which a halftone phase shifter is arranged in place of the light-shielding film 412 may be used as a mask 410. Other phase-shifting masks, e.g., a self-alignment phase-shifting mask, may also be used. An alternating phase-shifting mask in which a shifter or shifters are provided to either an opening 433 or openings 434 may be used as a mask 430. Also, a halftone phase shifter may be arranged in place of the light-shielding film 232 as a mask 230.

In this embodiment, the openings 434 are arranged one on each side of the opening 433. However, the present invention is not limited to this, and two or more openings 434 may be arranged, and alternatively an opening may surround an opening 433. An opening 434 must exist around the opening 433 to such a degree that the opening 433 does not stand as an isolated opening. Furthermore, as an illumination scheme in the first and second pattern transfer steps, an oblique intensity illumination scheme represented by an annular illumination scheme or an illumination scheme in which light is radiated from four regions remote from the optical axis may be employed.

In this embodiment, when a positive resist is used in place of the negative resist layer 422, an isolated space pattern and an isolated contact hole pattern can be formed. In this case, after the second pattern transfer step is completed, an image reversal step is performed to perform development, so that the resist pattern is reversed, thereby forming an isolated line pattern.

Embodiment 4

This embodiment relates to formation of an isolated line pattern by using a positive mask and a positive resist. FIGS. 10A to 10D are conceptual perspective views of a mask and an exposure substrate showing the steps of this embodiment. FIGS. 11A to 11D on the right side of FIGS. 10A to 10D are sectional views of portions indicated by an alternate long-and-short-dash line in FIGS. 10A to 10D, respectively.

As shown in FIGS. 10A and 11A, a mask (second mask) 110 used in the first pattern transfer step is obtained by forming a light-shielding portion (main pattern) 112 corresponding to the prospective final isolated projection pattern and light-shielding portions (auxiliary patterns) 113 having almost the same line width as that of the light-shielding portion 112 on the surface of a transparent substrate 111. A photosensitive substrate 120 is obtained by forming a positive resist 122 on a wafer 121. Although not shown, in actual LSI pattern formation, L/S patterns and isolated line patterns are mixed, and these patterns are mixedly formed in the mask 110.

When the substrate 120 is exposed to light through the mask 110, a portion corresponding to the transparent portion (where the light-shielding portions 112 and 113 do not exist) of the mask 110 is photosensitized (as indicated by hatched lines in FIGS. 10A and 11A).

As shown in FIGS. 10B and 11B, a mask (first mask) 130 used in the second pattern transfer step is obtained by forming a light-shielding portion 132, having a line width almost equal to or more than that of the light-shielding portion 112, on the surface of a transparent substrate 131. Although not shown, the light-shielding portion is formed in a region of the mask 130 corresponding to the L/S pattern on the mask 110.

The mask 130 and the substrate 120 are aligned such that a non-exposure portion corresponding to the light-shielding portion 112 of the mask 110 is formed in the non-exposure portion corresponding to the light-shielding portion 132 of the mask 130, and thereafter exposure is performed. After the two exposure operations are performed, only a portion 123 in FIGS. 10B and 11B remains as the non-exposure portion. Accordingly, when development is performed after this by using an alkali developing solution or the like, only the non-exposure portion 123 of the resist 122 remains, as shown in FIG. 12A, thereby forming a desired isolated line pattern.

In this embodiment, a phase-shifting mask in which halftone phase shifters are arranged in place of the light-shielding films 112, 113, and 132 may be used as masks 110 and 130. Other phase-shifting masks, e.g., a self-alignment phase-shifting mask, may also be used.

In this embodiment, the light-shielding portions 113 are arranged one on each side of the light-shielding portion 112 corresponding to the desired pattern. However, the present invention is not limited to this, and two or more light-shielding portions 113 may be arranged, and alternatively a light-shielding portion may surround a light-shielding portion 112. A light-shielding portion 113 must exist around the light-shielding portion 112 to such a degree that the light-shielding portion 112 does not stand as an isolated pattern. An alternating phase-shifting mask in which a shifter is provided to either one of the two light-transmitting portions between the light-shielding portions 112 and 113 may be used as a mask 110. Furthermore, as an illumination scheme in the first and second pattern transfer steps, an oblique illumination scheme represented by an annular illumination scheme or an illumination scheme in which light is radiated from four regions remote from the optical axis may be employed.

After the second pattern transfer step shown in FIGS. 10B and 11B is completed, an image reversal step is performed to perform development, so that the resist pattern may be reversed, thereby forming an isolated space pattern or an isolated contact hole pattern as shown in FIG. 12B. Furthermore, if this embodiment is performed by using a negative resist as the resist, an isolated space pattern and an isolated contact hole pattern can be similarly formed.

As described above, according to this embodiment, the isolated line patterns can be formed with the same resolution as that of the L/S pattern. Similarly, the isolated hole pattern and a high-density hole pattern can be formed with the same resolution. Therefore, resolution determination at an isolated portion in an actual LSI pattern, which occurs if a high-density pattern and an isolated pattern are present in the same layer does not take place, and the actual depth of focus is increased, enabling high-quality device pattern transfer. When the present invention is combined with the alternating phase-shifting mask and modified illumination, the resolution of not only the high-density pattern but also the isolated pattern is increased.

Embodiment 5

In this embodiment, an isolated line pattern is formed by using the same mask and by utilizing polarization of light. FIGS. 13A and 13B are sectional views showing the arrangements of an exposure mask and a photosensitive substrate, respectively, used in this embodiment, and FIGS. 14A to 14C are sectional views showing the micropattern forming steps using the exposure mask.

The exposure mask of this embodiment has an arrangement as shown in FIG. 13A. More specifically, a pattern 512 made of light-shielding material, e.g., a Cr or MoSi which is not transparent to exposure light is formed on a substrate 511 made of, e.g., quartz ($SiO_2$), $MgF_2$, or $CaF_2$ which is transparent to exposure light. Auxiliary openings 515 are formed in the vicinity of a main opening 514 corresponding to the isolated resist pattern. The auxiliary openings 515 have almost the same size as that of the main opening 514. Polarization layers 513 made of a polarizing material (e.g., one obtained by mixing a needle crystal of an iodide in a chain polymer compound of, e.g., polyvinyl alcohol or cellulose) that determines the vibrating direction of the electric field of the transmitted exposure light are formed on the auxiliary openings 515. FIG. 13A shows a case wherein only a polarization component in the vertical direction to the surface of paper is transmitted.

The thickness of the polarization layers 513 is determined such that the exposure light transmitted through the main opening 514 causes a phase difference of $(2n-1)\pi$ (n is an integer) with respect to the exposure light transmitted through the auxiliary openings 515 on which the polarization layers 513 are formed. In FIG. 13A, a phase difference of $(2n-1)\pi$ is caused by only the polarization layers 513. However, a layer for adjusting the phase difference and formed of a material, e.g., $SiO_2$, which is transparent to the exposure light, may be formed on or under the polarization layers 513 or in the main opening 514.

FIG. 13B shows the sectional structure of the exposure substrate used in this embodiment. A resist 517 is formed on an Si substrate 516, and a CEL layer 518 made of a CEL material is formed on the resist 517. The CEL material may be of any type as far as it has a transmittance for exposure light which increases upon being irradiated with the exposure light. Usually, the resist 517 has a thickness of about 1 μm, and the CEL layer 518 has a thickness of about 0.1 to 0.5 μm.

A micropattern forming method using the above exposure mask will be described. As shown in FIG. 14A, in the first transfer step, exposure is performed with linear polarization light which has a plane of polarization in the plane of the drawing. Then, the exposure light is transmitted through the main opening 514. However, in the auxiliary openings 515 in which the polarization layers 513 are formed, since the plane of polarization of the exposure light and the plane of polarization of the polarization film are orthogonal, the exposure light cannot be transmitted. Accordingly, of the CEL layer 518 on the exposure substrate, a portion 521 in FIG. 14A becomes transparent.

Subsequently, as shown in FIG. 14B, the second pattern transfer step is performed. In the second pattern transfer step, exposure is performed with linear polarization light which is polarized perpendicularly to the plane of the drawing. Then, the exposure light is transmitted through the main opening 514, and through the auxiliary openings 515 as well where the polarization layers 513 are formed. This is because the plane of polarization of the exposure light and that of the polarization film coincide with each other.

Since the portion 521 in FIG. 14A of the CEL layer 518 on the exposure substrate has become transparent due to the first transfer step, the pattern corresponding to the main opening 514 is photosensitized while accompanying a phase-shifting effect. However, since portions of the CEL layer 518 corresponding to the auxiliary openings 515 are not photosensitized, the exposure light of the patterns corresponding to the auxiliary openings 515 is absorbed and thus attenuated. Accordingly, by the second transfer step, of the resist 517 on the exposure substrate, a portion 522 in FIG. 14B is photosensitized.

FIG. 14C shows the third step. The third step is a developing step. The CEL layer 518 is removed by water, and then the resist 517 is developed. FIG. 14C shows a case wherein a negative resist is used. When a positive resist is used, the resist pattern is reversed, as a matter of course.

As described above, according to this embodiment, when the exposure mask as shown in FIG. 13A in which the polarization layers 513 are formed in the auxiliary openings 515 is used, the main pattern can be transferred with a high resolution as with the L/S pattern in the same manner as in the first to fourth embodiments, and transfer of the auxiliary patterns can be prohibited. In this embodiment, since two exposure operations can be performed by using the same mask, the exposure mask need not be exchanged. This eliminates a overlay error in the two exposing steps in principle, which is effective for improving the pattern precision.

In this embodiment, the polarization layers 513 are formed on the light-shielding layer 512. However, the present invention is not limited by this structure, and any other structure can be employed as far as it is optically equivalent to this. Light in the second pattern transfer step need not be linear polarization light which is polarized perpendicularly to the plane of the drawing, and can be of any type as far as it can be transmitted through the main opening 514 and the auxiliary openings 515. Non-polarization light, e.g., natural light may also be employed. Micropattern formation as shown in the first to fourth embodiments can be performed by using the exposure mask of the fifth embodiment.

In this embodiment, a mask pattern is transferred upon size reduction on the exposure substrate through the projection optical system by using light. However, the present invention is not limited to this, and can similarly be applied to proximity exposure and contact exposure that are not performed through a projection optical system. The present invention is also effective for an exposing method which uses light including X-rays as exposure light.

As has been described above in detail, according to the present invention, when two transfer steps are performed by using a first mask having a pattern of a size equal to or larger than that of the main pattern for pattern formation and a second mask having this main pattern for pattern formation and an auxiliary pattern formed in the vicinity of the main pattern and having almost the same size as the main pattern, an isolated pattern can be exposed with the same high resolution as for the L/S pattern without causing a difficulty in mask fabrication, thereby realizing a micropattern forming method suitable for formation of an LSI pattern.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A method of transferring a micropattern onto a substrate, comprising:
    the step of forming a multilayer film consisting of at least two layers on a substrate;
    the first exposing step of exposing an uppermost layer of the multilayer film through a first mask having a pattern not smaller than the micropattern;
    the step of positioning a second mask such that a main pattern thereof overlaps a transfer area of the uppermost layer of the multilayer film, the second mask having the main pattern corresponding to the micropattern and auxiliary patterns arranged in the vicinity of the main pattern; and
    the second exposing step of exposing a layer other than the uppermost layer of the multilayer film through the second mask.

2. A method according to claim 1, wherein the first and second masks are phase-shifting masks.

3. A method according to claim 2, wherein the first mask is one type selected from the group consisting of a halftone phase-shifting mask and a self-alignment phase-shifting mask, and the second mask is an alternating phase-shifting mask, and halftone phase shifting mask.

4. A method according to claim 1, wherein the first and second exposing steps are performed in accordance with an oblique illumination.

5. A method according to claim 1, wherein the multilayer film is a photosensitive film having not less than two layers.

6. A method according to claim 5, wherein the multilayer film includes a first photosensitive film which is an uppermost layer and photosensitive to light of the first exposing step, and a second photosensitive film which is photosensitive to light of the second exposing step.

7. A method according to claim 6, wherein the first photosensitive film becomes transparent to the light of the second exposing step upon being irradiated with the light of the first exposing step.

8. A method according to claim 6, wherein the first photosensitive film is insoluble in a developing solution and becomes soluble in the developing solution upon being irradiated with the light of the first exposing step.

9. A method according to claim 6, wherein the first photosensitive film is soluble in a developing solution and becomes insoluble in the developing solution upon being irradiated with the light of the first exposing step.

10. A method according to claim 6, wherein the second photosensitive film is soluble in a developing solution and becomes insoluble in the developing solution upon being irradiated with the light of the first exposing step.

11. A method according to claim 6, wherein the second photosensitive film is soluble in a developing solution and becomes insoluble in the developing solution upon being irradiated with the light of the first exposing step.

12. A method according to claim 6, wherein the second photosensitive film is a resist layer and the first photosensitive film is a contrast enhancement lithography layer.

13. A method according to claim 1, wherein the first exposing step is performed with MUV and the second exposing step is performed with DUV.

14. An exposure mask comprising:
    a transparent substrate; and
    a light-shielding film formed on the transparent substrate and having a main opening and at least one sub opening arranged in the vicinity of the main opening, wherein
    the sub opening has a polarization layer formed therein, and light transmitted through the main opening and light transmitted through the sub opening has a phase difference of $\pi(2n-1)$ where n is an integer and $\pi$ is the circle ratio.

15. A micropattern forming method for transferring, by using an exposure mask, a micropattern, formed on the exposure mask, onto a photosensitive substrate on which a multilayer film consisting of at least two layers is formed, the exposure mask comprising a transparent substrate and a light-shielding film formed on the transparent substrate and having a main opening and a sub opening arranged in the vicinity of the main opening, the sub opening having a polarization layer formed therein, and light transmitted through the main opening and light transmitted through the sub opening having a phase difference of $\pi(2n-1)$ where n is an integer and $\pi$ is the circle ratio, comprising:
    the first exposing step of exposing the photosensitive substrate with first polarization light having a component perpendicular to a direction of polarization of the polarization layer through the exposure mask; and
    the second exposing step of exposing the photosensitive substrate with second polarization light having a component parallel to the direction of polarization through the exposure mask.

16. A method according to claim 15, wherein the photosensitive substrate has a resist layer and a contrast enhancement lithography layer formed on the resist layer.

17. A method according to claim 15, wherein a portion of the contrast enhancement lithography layer that corresponds to the main opening becomes transparent by the first exposing step, and the resist layer is photosensitized by the second exposing step with light transmitted through the portion of the contrast enhancement lithography layer which has become transparent.

* * * * *